US011539386B2

(12) United States Patent
Nolan

(10) Patent No.: US 11,539,386 B2
(45) Date of Patent: Dec. 27, 2022

(54) COMMUNICATION CONDUITS WITHIN COMMUNICATIONS ASSEMBLIES

(71) Applicant: GENERAL ELECTRIC TECHNOLOGY GMBH, Baden (CH)

(72) Inventor: Andrew Patrick Nolan, Stafford (GB)

(73) Assignee: General Electric Technology GmbH, Baden (CH)

( * ) Notice: Subject to any disclaimer, the term of this patent is extended or adjusted under 35 U.S.C. 154(b) by 53 days.

(21) Appl. No.: 16/969,768

(22) PCT Filed: Feb. 12, 2019

(86) PCT No.: PCT/EP2019/053452
§ 371 (c)(1),
(2) Date: Aug. 13, 2020

(87) PCT Pub. No.: WO2019/158533
PCT Pub. Date: Aug. 22, 2019

(65) Prior Publication Data
US 2020/0412392 A1 Dec. 31, 2020

(30) Foreign Application Priority Data
Feb. 15, 2018 (EP) ..................................... 18157002

(51) Int. Cl.
*H04B 1/10* (2006.01)
*G01R 29/26* (2006.01)

(52) U.S. Cl.
CPC ............... *H04B 1/10* (2013.01); *G01R 29/26* (2013.01)

(58) Field of Classification Search
CPC . H04B 1/00; H04B 1/10; H04B 17/10; H04B 17/12; G01R 29/26; H03G 3/341; Y02E 60/60
See application file for complete search history.

(56) References Cited

U.S. PATENT DOCUMENTS 4,342,120 A * 7/1982 Settlemire .............. H03G 3/344
455/225
5,564,090 A * 10/1996 Beauchamp ........... H03G 3/341
375/351

(Continued)

FOREIGN PATENT DOCUMENTS

EP 2988403 A1 2/2016
JP 2008-066860 A 3/2008
WO 2016/116573 A1 7/2016

OTHER PUBLICATIONS

International Search Report of PCT/EP2019/053452 dated Feb. 12, 2019.

(Continued)

*Primary Examiner* — Thanh C Le
(74) *Attorney, Agent, or Firm* — Eversheds Sutherland (US) LLP

(57) ABSTRACT

In the field of communications assemblies, particularly those arising in connection with high voltage direct current (HVDC) power converters, there is provided a communications assembly (10) that comprises a first module (12) which is arranged in operative communication with a second module (14A, 14B, 14C, 14D, 14E, 14F, 14G, 14H) via a communication conduit (16A, 16B, 16C, 16D, 16E, 16F, 16G, 16H). At least one of the first module (12) and the second module (14A, 14B, 14C, 14D, 14E, 14F, 14G, 14H) have a receiver (24) that includes a squelch filter (26) which is configured to operate in a first normal mode and a second test mode. The squelch filter (26) normally operates in the first normal mode to suppress a signal output (28) from the receiver (24) when the strength of an input signal (30) received by the receiver (24), via the communication conduit (16A, 16B, 16C, 16D, 16E, 16F, 16G, 16H), falls below a normal threshold. The squelch filter (26) selectively operates in the second test mode to suppress the signal output (28)

(Continued)

from the receiver (24) when the strength of the input signal (30) received by the receiver (24), via the communication conduit (16A, 16B, 16C, 16D, 16E, 16F, 16G, 16H), falls below a test threshold higher than the normal threshold. When the squelch filter (26) is operating in the second test mode, a signal output (28) from the receiver (24) indicates a signal margin in the communication conduit (16A, 16B, 16C, 16D, 16E, 16F, 16G, 16H) that is at least equal to the difference between the test threshold and the normal threshold.

8 Claims, 1 Drawing Sheet

(56) References Cited

U.S. PATENT DOCUMENTS

| | | | |
|---|---|---|---|
| 6,055,421 A | 4/2000 | Zele et al. | |
| 6,564,041 B1* | 5/2003 | Stogner | H03G 3/342 |
| | | | 455/212 |
| 7,133,468 B2* | 11/2006 | Carter, Jr. | H03H 17/0261 |
| | | | 375/316 |
| 7,190,937 B1* | 3/2007 | Sullivan | H04B 17/382 |
| | | | 455/67.11 |
| 7,209,567 B1* | 4/2007 | Kozel | H04R 3/007 |
| | | | 704/226 |
| 7,653,367 B2* | 1/2010 | Song | H03G 3/341 |
| | | | 455/218 |
| 9,042,584 B2* | 5/2015 | Kwon | G10K 11/002 |
| | | | 381/94.1 |
| 2008/0057875 A1* | 3/2008 | Kawashima | H04L 1/0002 |
| | | | 455/67.14 |
| 2016/0065317 A1* | 3/2016 | Candage | H03F 1/26 |
| | | | 375/285 |
| 2020/0274504 A1* | 8/2020 | Singh | H03F 3/45179 |
| 2021/0313970 A1* | 10/2021 | Chen | H04B 1/16 |

OTHER PUBLICATIONS

European Search Report for Application No. 18157002.9 dated Feb. 8, 2018.

* cited by examiner

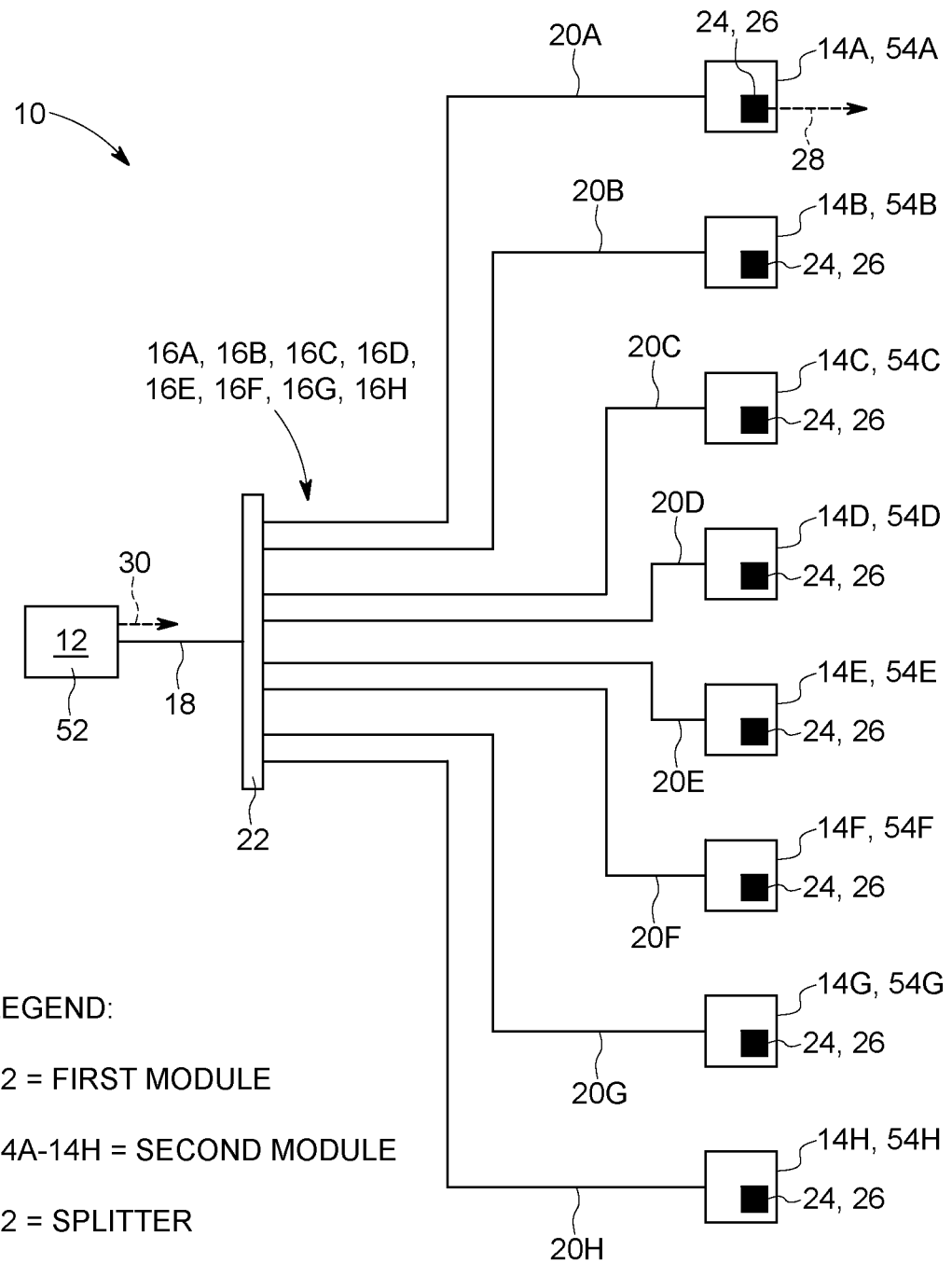

COMMUNICATION CONDUITS WITHIN COMMUNICATIONS ASSEMBLIES

CROSS-REFERENCE TO RELATED APPLICATIONS

This application is a U.S. National Stage Application under 35 U.S.C. 371 and claims the priority benefit of International Application No. PCT/EP2019/053452 filed Feb. 12, 2019, which claims priority to EP18157002.9, filed Feb. 15, 2018, which are both incorporated herein by reference.

This invention relates to a communications assembly comprising a first module arranged in operative communication with a second module via a communication conduit, and to a method of determining whether a signal margin exists in such a communication conduit.

Communications assemblies comprising a first module, such as a switching control unit, arranged in operative communication with one or more second modules, e.g. one or more switching sub-modules, via respective communication conduits, often arise in association with high voltage direct current (HVDC) power converters, which convert power between alternating current (AC) electrical power and high voltage direct current (DC) power in order to facilitate the transfer of such power between AC and DC networks within a HVDC power transmission network.

According to a first aspect of the invention there is provided a communications assembly comprising a first module arranged in operative communication with a second module via a communication conduit, at least one of the first module and the second module having a receiver including a squelch filter configured to operate in a first normal mode and a second test mode, the squelch filter normally operating in the first normal mode to suppress a signal output from the receiver when the strength of an input signal received by the receiver via the communication conduit falls below a normal threshold, and the squelch filter selectively operating in the second test mode to suppress the signal output from the receiver when the strength of the input signal received by the receiver via the communication conduit falls below a test threshold higher than the normal threshold, whereby when the squelch filter is operating in the second test mode a signal output from the receiver indicates a signal margin in the communication conduit at least equal to the difference between the test threshold and the normal threshold.

An advantage of knowing whether a signal margin exists in a given communication conduit helps to avoid any equipment with which the communication conduit is associated, e.g. a HVDC power converter, becoming unavailable and/or behaving erratically through a failure to be able to communicate correctly via the communication conduit.

In addition, the ability to demonstrate that a signal margin exists can help to alleviate any concerns a purchaser of such equipment may have about its reliability.

Moreover, in addition to the foregoing benefits, the normal and test thresholds of the squelch filter are well defined and so utilising them is desirable since they are able to provide an accurate measure of the size of any signal margin within the communication conduit.

Preferably when operating in the second test mode the squelch filter varies the test threshold.

When operating in the second test mode the squelch filter may increase the test threshold from a level equal to the normal threshold.

Such steps help to establish a test threshold at which there is a transition between the receiver providing an output signal and no longer doing so (or vice versa) which, in turn, establishes the extent of the signal margin on the communication conduit.

In a preferred embodiment of the invention each of the first module and the second module has a transceiver including a squelch filter configured to operate in the said first normal mode and second test mode.

The inclusion of such a transceiver in each of the first module and the second module provides the flexibility of testing for a signal margin in the communication conduit using an input signal travelling in either direction between the first and second modules.

Optionally the first module is arranged in operative communication with a plurality of said second modules via a corresponding plurality of respective communication conduits.

In another preferred embodiment of the invention each communication conduit includes at least first and second conduit portions interconnected by a splitter whereby the respective communication conduits share a common first conduit portion while retaining individual respective second conduit portions.

The foregoing arrangements extend the benefits of being able to establish a signal margin within a communication conduit to further communications assembly configurations.

Preferably the first module is or includes a switching control unit and the second module is or includes a switching sub-module.

Such a communications assembly is directly deployable within a HVDC power converter.

According to a second aspect of the invention there is provided a method of determining whether a signal margin exists in a communication conduit within a communications assembly comprising a first module arranged in operative communication with a second module via a said communication conduit, the method comprising the steps of:

(a) providing at least one of the first module and the second module with a receiver including a squelch filter configured to operate in a first normal mode and a second test mode;

(b) normally operating the squelch filter in the first normal mode to suppress a signal output from the receiver when the strength of an input signal received by the receiver via the communication conduit falls below a normal threshold; and (c) selectively operating the squelch filter in the second test mode to suppress the signal output from the receiver when the strength of the input signal received by the receiver via the communication conduit falls below a test threshold higher than the normal threshold, whereby a signal output from the receiver indicates a signal margin in the communication conduit at least equal to the difference between the test threshold and the normal threshold.

The method of the invention shares the benefits associated with the corresponding features of the communications assembly of the invention.

There now follows a brief description of preferred embodiments of the invention, by way of non-limiting example, with reference being made to FIG. 1 which shows a schematic view of a communications assembly according to a first embodiment of the invention.

A communications assembly according to a first embodiment of the invention is designated generally by reference numeral 10, as shown in FIG. 1.

The electrical assembly 10 includes a first module 12 that is arranged in operative communication with a plurality of second modules 14A, 14B, 14C, 14D, 14E, 14F, 14G, 14H via a corresponding plurality of respective communication conduits 16A, 16B, 16C, 16D, 16E, 16F, 16G, 16H. In the embodiment shown, the first module 12 is a switching control unit 52 and each second module 14A, 14B, 14C, 14D, 14E, 14F, 14G, 14H is a switching sub-module 54A, 54B, 54C, 54D, 54E, 54F, 54G, 54H, although this need not necessarily be the case. Moreover, in other embodiments of the invention the first module, e.g. a switching control unit, may be arranged in operative communication with only a single second module, e.g. only a single switching sub-module, via a single communication conduit.

By way of example, each of the switching sub-modules 54A, 54B, 54C, 54D, 54E, 54F, 54G, 54H may include a number of switching elements that are connected in parallel with an energy storage device in the form of a capacitor, so as to define a chain-link sub-module that is operable to provide a voltage source. The switching sub-modules 54A, 54B, 54C, 54D, 54E, 54F, 54G, 54H, i.e. the chain-link sub-modules, may together define a chain-link converter that is able to provide a stepped variable voltage source, and such a chain-link converter may be incorporated within a voltage source converter to provide a particular type of HVDC power converter that is able to transfer power between AC and DC networks within a HVDC power transmission scheme.

The first module and one or more second modules may, however, also form a part of other types of communications assembly.

Returning to the embodiment shown, each communication conduit 16A, 16B, 16C, 16D, 16E, 16F, 16G, 16H includes first and second conduit portions 18, 20 that are interconnected by a splitter 22. More particularly, the respective communication conduits 16A, 16B, 16C, 16D, 16E, 16F, 16G, 16H share a common first conduit portion 18 and have individual respective second conduit portions 20A, 20B, 20C, 20D, 20E, 20F, 20G, 20H.

In the embodiment shown each of the conduit portions 18, 20A, 20B, 20C, 20D, 20E, 20F, 20G, 20H is defined by an electromagnetic radiation conduit, and more particularly by an optical conduit in the form of a fibre optic cable, and the splitter 22 takes the form of an optical splitter. In this manner, the foregoing components define a passive optical network (PON), although other arrangements of communication network are also possible.

Each second module 14A, 14B, 14C, 14D, 14E, 14F, 14G, 14H, i.e. each switching sub-module 54A, 54B, 54C, 54D, 54E, 54F, 54G, 54H, has a receiver 24 that includes a squelch filter 26 which is configured to operate in a first normal mode and a second test mode.

In other embodiments of the invention (not shown) the first module and each of the second modules may instead each have a transceiver that includes a squelch filter that is configured to operate in the said first normal mode and second test mode. Alternatively, in still further embodiments of the invention (also not shown) only the first module may have receiver that includes a squelch filter which is configured to operate in the said first normal mode and second test mode.

In each case, in the first normal mode, each squelch filter 26 operates to suppress a signal output 28 from the receiver 24 when the strength of an input signal 30, e.g. a switching command signal from the switching control unit 52, received by the receiver 24 via the corresponding communication conduit 16A, 16B, 16C, 16D, 16E, 16F, 16G, 16H falls below a normal threshold.

In the second test mode, each squelch filter 26 operates to suppress the signal output 28 from the receiver 24 when the strength of the input signal 30 received by the receiver 24 via the corresponding communication conduit 16A, 16B, 16C, 16D, 16E, 16F, 16G, 16H falls below a test threshold which is higher than the normal threshold. Preferably the test threshold is 3 dB higher than the normal threshold, although it may be more than or less than 3 dB higher.

Accordingly, in use, the squelch filter 26 in a first switching sub-module 54A, by way of example, normally operates in the first normal mode, whereby the signal output 28 from the corresponding receiver 24 is only suppressed when the strength of the input signal 30, i.e. the switching command signal from the switching control unit 52, received by the receiver 24 via the corresponding first communication conduit 16A falls below the normal threshold.

It follows that, absent an unexpected degradation or fault, e.g. high noise, in the input signal 30, the squelch filter 26 when operating in the first normal mode acts to allow the input signal 30 to pass through the receiver 24 and be output as a signal output 28, e.g. to provide for normal control of the first switching sub-module 54A by the switching control unit 52.

When it is desired to test whether there is a signal margin in the first communication conduit 16A, the squelch filter 26 in the first switching sub-module 54A is selectively, i.e. temporarily, operated in the second test mode. In such a second test mode, the signal output 28 from the corresponding receiver 24 is suppressed when the strength of the input signal 30 received by the receiver 24 via the first communication conduit 16A falls below the higher, e.g. 3 dB higher, test threshold.

It follows that if the input signal 30 received by the receiver 24 in the first switching sub-module 54A, via the first communication conduit 16A, is too weak to overcome the test threshold, e.g. because of signal losses within the first communication conduit 16A arising from a poorly made or dirty joint therewithin, then the squelch filter 26 suppresses the signal output 28 from the receiver 24, and so there is temporarily no output from the receiver 24.

In contrast, if the output signal 30 received by the receiver 24 is strong enough to overcome the test threshold then the squelch filter 26 allows the input signal 30 to pass through the receiver 24 and there is a signal output 28 from the said receiver 24. Such a signal output 28 thereby indicates that there is a signal margin in the first communication conduit 16A which is at least equal to the difference between the test threshold and the normal threshold, i.e. which is at least 3 dB in the example embodiment described herein.

In other embodiments of the invention, a given squelch filter when operating in the second, test mode may vary the test threshold, and in particular may increase the test threshold from a level equal to the normal threshold.

Such steps help to establish the exact test threshold at which there is a transition between the receiver providing an output signal and no longer doing so which, in turn, establishes the extent, i.e. upper limit, of the signal margin on the corresponding communication conduit.

The invention claimed is:
1. A communications assembly comprising:
a first module arranged in operative communication with a second module via a communication conduit,
at least one of the first module and the second module having a receiver including a squelch filter configured to operate in a first normal mode and a second test mode, the squelch filter normally operating in the first normal mode to suppress a signal output from the receiver when the strength of an input signal received by the receiver via the communication conduit falls below a normal threshold indicative of signal degradation, and the squelch filter selectively operating temporarily in the second test mode, based on when the input signal being greater than the normal threshold, to suppress the signal output from the receiver when the strength of the input signal received by the receiver via the communication conduit falls below a test threshold higher than the normal threshold, whereby when the squelch filter is operating in the second test mode a signal output from the receiver indicates a signal margin in the communication conduit at least equal to the difference between the test threshold and the normal threshold.

2. The communications assembly according to claim 1, wherein when operating in the second test mode the squelch filter varies the test threshold.

3. The communications assembly according to claim 2, wherein when operating in the second test mode the squelch filter increases the test threshold from a level equal to the normal threshold.

4. The communications assembly according to claim 1, wherein each of the first module and the second module has a transceiver including a squelch filter configured to operate in the first normal mode and second test mode.

5. The communications assembly according to claim 4, wherein each communication conduit includes at least first and second conduit portions interconnected by a splitter whereby the respective communication conduits share a common first conduit portion while retaining individual respective second conduit portions.

6. The communications assembly according to claim 1, wherein the first module is arranged in operative communication with a plurality of the second modules via a corresponding plurality of respective communication conduits.

7. The communications assembly according to claim 1, wherein the first module is or includes a switching control unit and the second module is or includes a switching sub-module.

8. A method of determining whether a signal margin exists in a communication conduit within a communications assembly comprising a first module arranged in operative communication with a second module via a said communication conduit, the method comprising:

providing at least one of the first module and the second module with a receiver including a squelch filter configured to operate in a first normal mode and a second test mode;

operating the squelch filter in the first normal mode to suppress a signal output from the receiver when the strength of an input signal received by the receiver via the communication conduit falls below a normal threshold indicative of signal degradation; and selectively operating the squelch filter temporarily in the second test mode, based on when the input signal being greater than the normal threshold, to suppress the signal output from the receiver when the strength of the input signal received by the receiver via the communication conduit falls below a test threshold higher than the normal threshold, whereby a signal output from the receiver indicates a signal margin in the communication conduit at least equal to the difference between the test threshold and the normal threshold.

* * * * *